(12) United States Patent
Xu et al.

(10) Patent No.: US 12,507,554 B2
(45) Date of Patent: Dec. 23, 2025

(54) DISPLAY PANEL AND DISPLAY APPARATUS

(71) Applicant: BOE Technology Group Co., Ltd., Beijing (CN)

(72) Inventors: Pan Xu, Beijing (CN); Yicheng Lin, Beijing (CN); Xing Zhang, Beijing (CN); Ying Han, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 576 days.

(21) Appl. No.: 17/920,343

(22) PCT Filed: May 8, 2021

(86) PCT No.: PCT/CN2021/092440
§ 371 (c)(1),
(2) Date: Oct. 20, 2022

(87) PCT Pub. No.: WO2021/227996
PCT Pub. Date: Nov. 18, 2021

(65) Prior Publication Data
US 2023/0172023 A1    Jun. 1, 2023

(30) Foreign Application Priority Data

May 9, 2020    (CN) .......................... 202010386601.6

(51) Int. Cl.
*H10K 59/131*    (2023.01)
*H10K 59/122*    (2023.01)
*H10K 59/80*    (2023.01)

(52) U.S. Cl.
CPC ... *H10K 59/1315* (2023.02); *H10K 59/80521* (2023.02); *H10K 59/122* (2023.02)

(58) Field of Classification Search
CPC ......... H10K 59/1315; H10K 59/80521; H10K 59/122
See application file for complete search history.

(56) References Cited

U.S. PATENT DOCUMENTS

2012/0001885 A1    1/2012  Kang et al.
2016/0293888 A1   10/2016  Shim et al.
(Continued)

FOREIGN PATENT DOCUMENTS

CN    103700675 A    4/2014
CN    103700694 A    4/2014
(Continued)

OTHER PUBLICATIONS

CN202010386601.6 first office action.
PCT/CN2021/092440 international search report.

*Primary Examiner* — Mary Ellen Bowman
(74) *Attorney, Agent, or Firm* — IPro, PLLC

(57) ABSTRACT

Disclosed are a display panel and a display apparatus. The display panel includes: a base substrate, an anode layer, a cathode layer, an organic functional layer and cathode signal lines, wherein the anode layer is located on the base substrate; the cathode layer is located on the side of the anode layer that faces away from the base substrate, and the orthographic projection of the cathode layer on the base substrate overlaps with both a display area and a non-display area; the organic functional layer is located between the anode layer and the cathode layer, and the orthographic projection of the organic functional layer on the base substrate overlaps with the display area; the cathode signal lines are located on the side of the organic functional layer that is close to the base substrate, and the cathode signal lines are located in the non-display area.

20 Claims, 4 Drawing Sheets

(56) References Cited

U.S. PATENT DOCUMENTS

| | | | |
|---|---|---|---|
| 2019/0097162 A1* | 3/2019 | Wang | H10K 50/844 |
| 2019/0288056 A1 | 9/2019 | Xiao et al. | |
| 2020/0279521 A1* | 9/2020 | Ma | G09G 3/2092 |
| 2021/0257440 A1 | 8/2021 | Long et al. | |

FOREIGN PATENT DOCUMENTS

| | | |
|---|---|---|
| CN | 107093618 A | 8/2017 |
| CN | 107170783 A | 9/2017 |
| CN | 108231847 A | 6/2018 |
| CN | 109166886 A | 1/2019 |
| CN | 109273516 A | 1/2019 |
| CN | 109658824 A | 4/2019 |
| CN | 109950297 A | 6/2019 |
| CN | 110473896 A | 11/2019 |
| CN | 209729911 U | 12/2019 |
| CN | 209822646 U | 12/2019 |
| CN | 111524956 A | 8/2020 |
| IN | 111129093 A | 5/2020 |

\* cited by examiner

DISPLAY PANEL AND DISPLAY APPARATUS

CROSS REFERENCE TO RELATED APPLICATIONS

The present disclosure is a US National Stage of International Application No. PCT/CN2021/092440, filed on May 8, 2021 which claims the benefit of priority to Chinese Patent Application No. 202010386601.6, filed to the China Patent Office on May 9, 2020 and entitled "DISPLAY PANEL AND DISPLAY APPARATUS", which is incorporated in its entirety herein by reference.

FIELD

The present disclosure relates to the technical field of display, and in particular to a display panel and a display apparatus.

BACKGROUND

In the field of display, by virtue of excellent properties such as low power consumption, high color saturation, wide viewing angle, small thickness and achievable flexibility, organic light-emitting diode (OLED) display panels have gradually become mainstream display panels in the field of display, and can be extensively used in terminal products such as smart phones, tablet computers and televisions. The OLED display panel includes an anode layer, a cathode layer and an organic functional layer located between the anode layer and the cathode layer. By applying an anode signal to the anode layer and applying a cathode signal to the cathode layer, the organic functional layer can be driven to emit light, so as to display a picture.

In the related art, in order to provide a cathode signal for a cathode layer, a cathode signal line is required to be connected to the cathode layer, and the cathode signal provided by a signal source is transmitted to the cathode layer by the cathode signal line. However, a cathode signal line is generally arranged on a certain side of a display panel, and in a process of transmitting a cathode signal, due to resistance of the cathode signal line and a cathode layer, an IR drop of the cathode signal at a position far from the signal source is great. Accordingly, voltage differences of the cathode signal at different positions of the cathode layer are great, thereby causing poor display uniformity of the display panel.

SUMMARY

An embodiment of the present disclosure provides a display panel. The display panel is provided with a display area and a non-display area surrounding the display area, and includes: a base substrate; an anode layer arranged on the base substrate; a cathode layer arranged on a side of the anode layer facing away from the base substrate, where an orthographic projection of the cathode layer on the base substrate overlaps orthographic projections of the display area and the non-display area on the base substrate; an organic functional layer arranged between the anode layer and the cathode layer, where an orthographic projection of the organic functional layer on the base substrate overlaps the orthographic projection of the display area on the base substrate; and a cathode signal line arranged on a side of the organic functional layer close to the base substrate, where the cathode signal line is arranged in the non-display area, an orthographic projection of the cathode signal line on the base substrate and the orthographic projection of the organic functional layer on the base substrate have a non-overlapping area, the non-overlapping area includes at least two mutually separated sub-areas, and the cathode signal line is coupled to the cathode layer in the at least two mutually separated sub-areas.

Optionally, in an embodiment of the present disclosure, the cathode signal line surrounds the display area.

Optionally, in an embodiment of the present disclosure, the display panel further includes: a pixel defining layer arranged on the side of the anode layer facing away from the base substrate.

The pixel defining layer includes a first via hole arranged in the non-display area.

The cathode signal line is arranged on a side of the pixel defining layer close to the base substrate, and the cathode signal line is coupled to the cathode layer through the first via hole.

Optionally, in an embodiment of the present disclosure, the cathode signal line includes: a first wire arranged on the same layer as the anode layer, and the first wire is coupled to the cathode layer through the first via hole.

Optionally, in an embodiment of the present disclosure, the cathode signal line includes: a first wire, and a second wire arranged on a side of the first wire close to the base substrate; and the first wire is coupled to the cathode layer through the first via hole, and the first wire is coupled to the second wire through a second via hole. The second via hole penetrates an insulating layer between the first wire and the second wire.

Optionally, in an embodiment of the present disclosure, the first wire is coupled to the second wire through a plurality of second via holes.

Optionally, in an embodiment of the present disclosure, the display panel further includes: a source and drain metal layer arranged on a side of the anode layer close to the base substrate, and a gate metal layer arranged on a side of the source and drain metal layer close to the base substrate; the first wire is arranged on a same layer as the anode layer; and the second wire is arranged on a same layer as the source and drain metal layer, or the second wire is arranged on a same layer as the gate metal layer.

Optionally, in an embodiment of the present disclosure, the cathode signal line includes: a first wire, a second wire arranged on a side of the first wire close to the base substrate, and a third wire arranged on a side of the second wire close to the base substrate.

The first wire is coupled to the cathode layer through the first via hole, and the first wire is coupled to the second wire through a second via hole. The second wire is coupled to the third wire through a third via hole. The second via hole penetrates an insulating layer between the first wire and the second wire. The third via hole penetrates an insulating layer between the second wire and the third wire.

Optionally, in an embodiment of the present disclosure, the first wire is coupled to the second wire through a plurality of second via holes; and/or the second wire is coupled to the third wire through a plurality of third via holes.

Optionally, in an embodiment of the present disclosure, the display panel further includes: a source and drain metal layer arranged on a side of the anode layer close to the base substrate, and a gate metal layer arranged on a side of the source and drain metal layer close to the base substrate.

The first wire is arranged on the same layer as the anode layer, the second wire is arranged on the same layer as the source and drain metal layer, and the third wire is arranged on the same layer as the gate metal layer.

Optionally, in an embodiment of the present disclosure, the display panel further includes: a sealant structure arranged in the non-display area; the sealant structure is arranged on a side of the cathode layer facing away from the base substrate; and an orthographic projection of the sealant structure on the base substrate at least partially overlaps the orthographic projection of the cathode signal line on the base substrate.

Optionally, in an embodiment of the present disclosure, the display panel further includes: a pixel defining layer arranged on the side of the anode layer facing away from the base substrate, and a planarization layer arranged on a side of the anode layer close to the base substrate.

The non-display area is provided with a through groove penetrating the pixel defining layer and the planarization layer, and the through groove surrounds the display area.

At least part of the sealant structure is arranged in the through groove.

Optionally, in an embodiment of the present disclosure, at least part of the cathode signal line is arranged in the through groove, and the orthographic projection of the cathode signal line on the base substrate is arranged within a range of an orthographic projection of the through groove on the base substrate.

Part of the cathode layer is embedded in the through groove and is in lap joint with the cathode signal line.

The part of cathode layer embedded in the through groove forms a groove surrounding the display area, and at least the sealant structure is arranged in the groove.

Optionally, in an embodiment of the present disclosure, a surface of a side of the sealant structure facing away from the base substrate is raised relative to a surface of a side of the cathode layer arranged outside the through groove and facing away from the base substrate.

Optionally, in an embodiment of the present disclosure, the display panel further includes: an inorganic layer arranged between the sealant structure and the cathode layer and covering the display area and the non-display area.

Optionally, in an embodiment of the present disclosure, the display panel further includes: a color film layer arranged on a side of the inorganic layer facing away from the base substrate.

The color film layer fills an area surrounded by the sealant structure; and a surface of a side of the color film layer facing away from the base substrate is flush with a surface of a side of the sealant structure facing away from the base substrate.

Optionally, in an embodiment of the present disclosure, the display panel further includes: a cover plate arranged on the sides of the sealant structure and the color film layer that face away from the base substrate.

Optionally, in an embodiment of the present disclosure, the sealant structure is in a closed-ring shape surrounding the display area.

Optionally, in an embodiment of the present disclosure, the through groove and the sealant structure have the same shape, and the through groove is of a closed structure.

Optionally, in an embodiment of the present disclosure, a shape of the display panel is an elliptical, round or rectangular.

Correspondingly, an embodiment of the present disclosure further provides a display apparatus. The display apparatus includes any one of the above display panels.

DETAILED DESCRIPTION OF THE EMBODIMENTS

In order to make objectives, technical solutions and advantages of the present disclosure clearer, specific implementations of a display panel and a display apparatus provided in embodiments of the present disclosure will be described in detail below in combination with the accompanying drawings.

A thickness and a shape of a film on each layer in the accompanying drawings do not reflect a real ratio of the display panel, and only are intended to illustrate the contents of the present disclosure.

Figure 1:
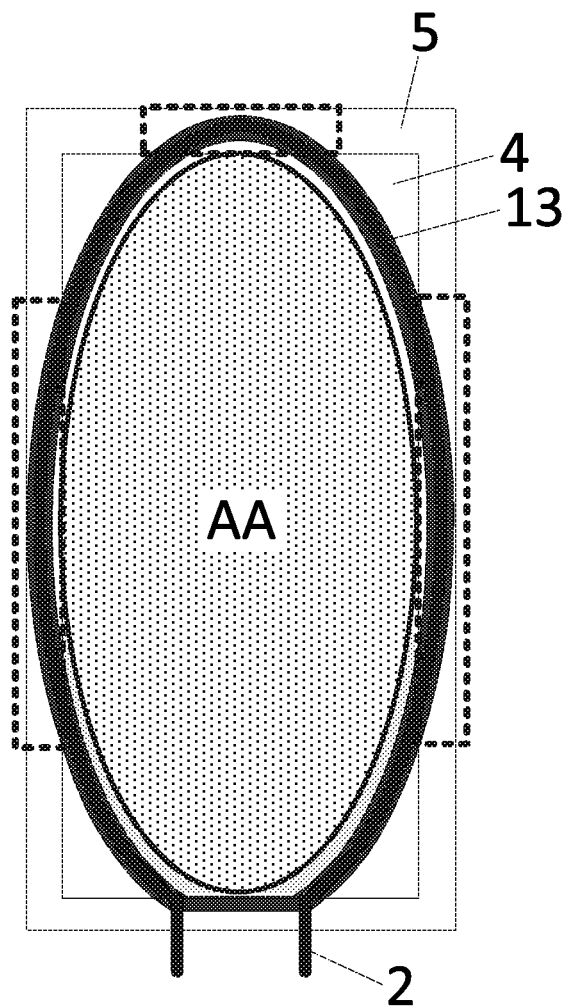
FIG. 1 is a schematic structural diagram in a top view of a display panel according to an embodiment of the present disclosure.

FIG. 1 is a schematic structural diagram in a top view of a display panel according to an embodiment of the present disclosure. As shown in FIG. 1, the display panel provided in an embodiment of the present disclosure is provided with a display area AA and a non-display area (i.e., an area around the area AA) surrounding the display area AA. The display panel provided in an embodiment of the present disclosure may be in a rectangular shape, or the display panel provided in an embodiment of the present disclosure may be in irregular shape. For example, the display panel may be in an elliptical, round or heart shape, etc. Certainly, the display panel in an embodiment of the present disclosure may be in other shapes, which is not limited herein.

Figure 2:
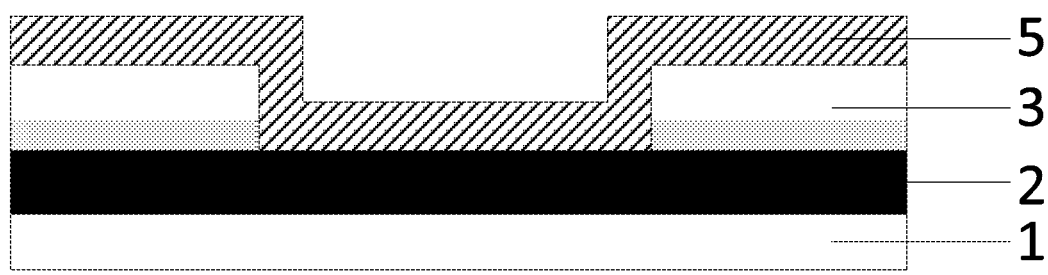
FIG. 2 is a first schematic structural diagram of a display panel according to an embodiment of the present disclosure.

FIG. 2 is a schematic structural diagram of a section of part of a film layer in areas circled by dotted line boxes in FIG. 1. As shown in FIGS. 1 and 2, the display panel may include: a base substrate 1; an anode layer (not shown in FIGS. 1 and 2) arranged on the base substrate 1; a cathode layer 5 arranged on a side of the anode layer that faces away from the base substrate, where an orthographic projection of the cathode layer 5 on the base substrate 1 overlaps an orthographic projection of the display area AA on the base substrate 1 and an orthographic projection of the non-display area on the base substrate 1; an organic functional layer 4 arranged between the anode layer and the cathode layer 5, where an orthographic projection of the organic functional layer 4 on the base substrate 1 overlaps the orthographic projection of the display area AA on the base substrate 1; and a cathode signal line 2 arranged on a side of the organic functional layer 4 that is close to the base substrate 1, where the cathode signal line 2 is arranged in the non-display area, an orthographic projection of the cathode signal line 2 on the base substrate 1 and the orthographic projection of the organic functional layer 4 on the base substrate 1 have a non-overlapping area (such as areas circled by dotted line boxes in FIG. 1), the non-overlapping area includes at least two mutually separated sub-areas, for example, the non-overlapping area includes three mutually separated sub-areas in FIG. 1, and the cathode signal line 2 is coupled to the cathode layer 2 in the at least two mutually separated sub-areas.

In the above display panel provided in an embodiment of the present disclosure, the cathode signal line 2 that is arranged on a different layer from the cathode layer 5 and is coupled to the cathode layer 5 is arranged, the cathode signal line 2 is arranged in the non-display area, and the cathode signal line is coupled to the cathode layer in at least two mutually separated sub-areas. Compared with the related art in which a cathode signal line is arranged on a certain side of a display panel, a contact area between the cathode signal line 2 and the cathode layer 5 is enlarged according to an embodiment of the present disclosure, such that equivalent resistance at a junction between the cathode signal line 2 and the cathode layer 5 is reduced. Moreover, the cathode signal line 2 may provide a cathode signal for the cathode layer 5 by means of the at least two mutually separated sub-areas, such that a voltage drop amplitude of the cathode signal at a position far away from a signal source is reduced. Therefore, by inputting the cathode signal into the cathode layer 5 by the cathode signal line 2, an IR drop of the cathode layer 5 is reduced, and display uniformity of the display panel is improved. In addition, in an embodiment of the present disclosure, by arranging the cathode signal line 2 in the non-display area, the cathode signal line 2 may be prevented from affecting a display effect of the display panel.

With further reference to FIGS. 1 and 2, during specific implementation, the display panel may include a plurality of sub-pixels arranged in the display area AA, the anode layer may include a plurality of anodes separately arranged, and each sub-pixel is internally provided with an anode. In addition, an orthographic projection of the cathode layer on the base substrate overlaps orthographic projections of the display area and the non-display area on the base substrate. In a working process of the display panel, different anode signals may be applied to the anodes, and cathode signals may be applied to the cathode layer, so as to drive the organic functional layer in the sub-pixels to emit light, thereby displaying a picture. Optionally, the cathode layer may be arranged over an entire surface, and the cathode layer may be patterned in a camera area under a screen. Certainly, the cathode layer may be patterned in other areas, and a specific pattern of the cathode layer is not limited herein.

Since the orthographic projection of the cathode layer 5 on the base substrate 1 overlaps the orthographic projection of the display area AA on the base substrate 1, the cathode signals may be conveniently provided for the sub-pixels in the display area AA. In addition, since the orthographic projection of the cathode layer 5 on the base substrate 1 overlaps the orthographic projection of the non-display area on the base substrate 1, the orthographic projection of the cathode layer 5 on the base substrate 1 may overlap the orthographic projection of the cathode signal line 2 on the base substrate 1. Therefore, the cathode signal line 2 may be conveniently coupled to the cathode layer 5, so as to provide signals for the cathode layer 5 by the cathode signal line 2.

In an actual process, the organic functional layer is made through an evaporation or ink-jet printing method. Due to the limitation of a process, the formed organic functional layer is generally integrally in a rectangular shape, and due to the limitations of a process and a material, the formed organic functional layer is generally not patterned. In addition, the cathode layer is arranged on a side of the organic functional layer that faces away from the base substrate, and the cathode signal line is arranged on a side of the organic functional layer that is close to the base substrate, such that the cathode signal line may not be coupled to the cathode layer in an area covered with the organic functional layer, and the cathode signal line may be coupled to the cathode layer in an area not covered with the organic functional layer.

In the case that the display panel is in a rectangular shape, the organic functional layer only covers the display area, or the organic functional layer covers the display area and is slightly beyond an edge of the display area, the organic functional layer does not cover the cathode signal line, and a lap joint area between the cathode signal line and the cathode layer is large.

In the case that the display panel is in an irregular shape, as shown in FIG. 1, the display panel in an elliptical shape is taken as an example, the organic functional layer 4 and the display area AA are in different shapes, the organic functional layer 4 completely covers the display area AA and partially covers the non-display area, an orthographic projection of the organic functional layer 4 on the base substrate and an orthographic projection of the cathode signal line 2 on the base substrate have a non-overlapping area, and the non-overlapping area includes at least two mutually separated sub-areas. For example, in FIG. 1, the organic functional layer 4 covers a pattern of the cathode signal line 2 at an upper left corner, an upper right corner, a lower left corner and a lower right corner, the organic functional layer 4 and the cathode signal line 2 have a non-overlapping area on an upper side, a left side and a right side of the display area AA, and the non-overlapping area includes three mutually separated sub-areas arranged on the upper side, the left side and the right side of the display area AA. In the case that the organic functional layer 4 is made through an evaporation method, the formed organic functional layer 4 is a film layer over an entire surface. Therefore, the cathode signal line 2 may not be coupled to the cathode layer 5 in an overlapping area of the organic functional layer 4 and the cathode signal line 2, and the cathode signal line 2 may be coupled to the cathode layer 5 in a non-overlapping area of the cathode signal line 2 and the organic functional layer 4. After all film layers of the display panel are made, the redundant organic functional layer 4 and cathode layer 5 outside the non-display area are cut off to form an elliptical display panel as shown in FIG. 1. In the case that the organic functional layer 4 is made through an ink-jet printing method, the organic functional layer 4 is discontinuous. Therefore, the cathode signal line 2 may be coupled to the cathode layer 5 in an overlapping area of the organic functional layer 4 and the cathode signal line 2. In an actual making process, a process of making an organic functional layer 4 may be selected according to actual requirements, so as to make a contact area between the cathode signal line 2 and the cathode layer 5 large.

Optionally, the cathode signal line may surround the display area, for example, the cathode signal line may half-surround the display area, or the cathode signal line may fully surround the display area. Moreover, since the cathode signal line is required to be coupled to a signal source of the cathode signal, the cathode signal line is generally not in a closed shape. As shown in FIG. 1, the cathode signal line 2 is coupled to the signal source on a lower side of the display area AA, such that two ends of the cathode signal line 2 may be arranged on the lower side of the display area AA, and the cathode signal line 2 may pass through a non-display area on an upper side, a left side and a right side outside the display area AA. Therefore, in an embodiment of the present disclosure, the cathode signal line 2 surrounding the display area AA is arranged, and the cathode signal line 2 may be coupled to the cathode layer 5 on a side of the display area AA, and may also be coupled to the cathode layer 5 in the non-display area on the upper side, the left side and the right side outside the display area AA, such that the contact area between the cathode signal line 2 and the cathode layer 5 is enlarged, and equivalent resistance at a junction between the cathode signal line 2 and the cathode layer 5 is reduced. In addition, the cathode signal line 2 may apply a cathode signal to the cathode layer 5 at a plurality of positions such that an IR drop of the cathode signal in the cathode layer 5 may be reduced, and desirable uniformity of the cathode signal in the cathode layer 5 may be obtained.

Figure 3:
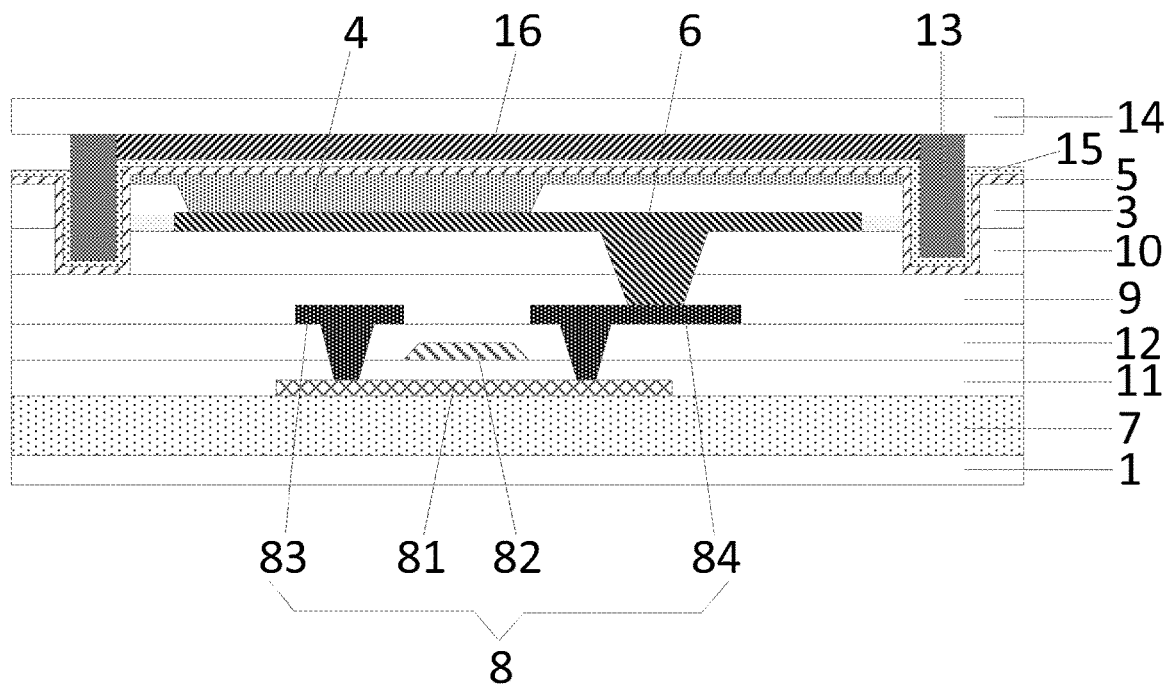
FIG. 3 is a second schematic structural diagram of a display panel according to an embodiment of the present disclosure.
Figure 4:
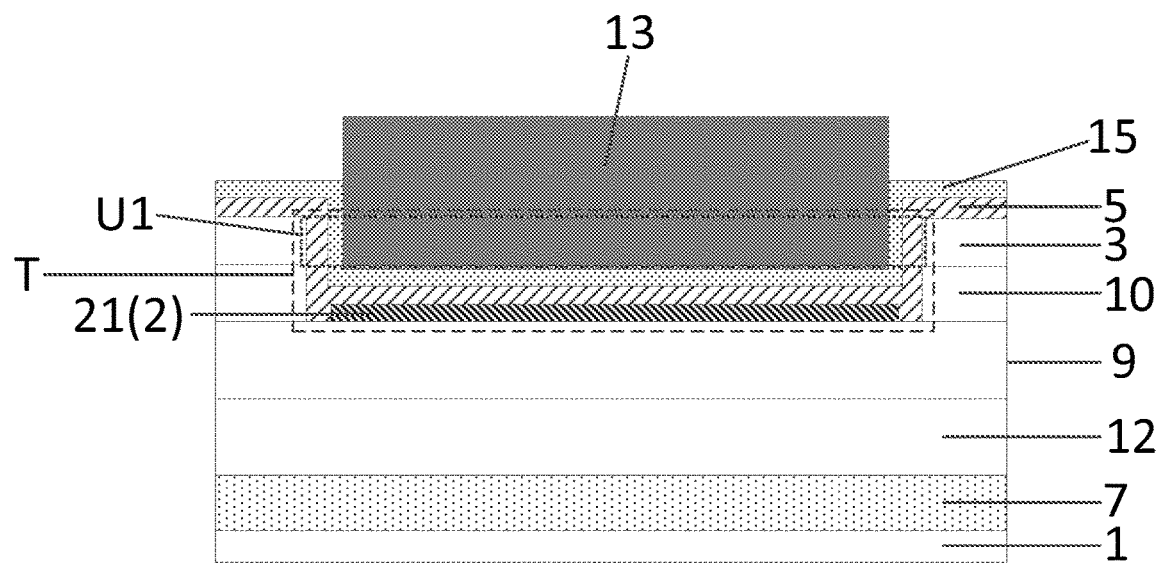
FIG. 4 is a third schematic structural diagram of a display panel according to an embodiment of the present disclosure.

FIG. 3 is a schematic structural diagram of a section of the display area AA in FIG. 1, and FIG. 4 is a schematic structural diagram of another section of the non-display area in FIG. 1. As shown in FIGS. 3 and 4, the display panel provided in an embodiment of the present disclosure may further include: a pixel defining layer 3 arranged on a side of the anode layer 6 that faces away from the base substrate 1, the pixel defining layer 3 is provided with a plurality of openings in the display area, the anodes of the anode layer 6 correspond to the openings of the pixel defining layer 3 in a one-to-one correspondence manner, and the openings may expose the corresponding anodes, such that the anodes are in contact with the organic functional layer 4.

The pixel defining layer 3 may include a first via hole U1 arranged in the non-display area, and the cathode signal line 2 is arranged on a side of the pixel defining layer 3 that is close to the base substrate 1, and the cathode signal line 2 is coupled to the cathode layer 5 through the first via hole U1. In an embodiment of the present disclosure, the cathode signal line 2 is arranged on the side of the pixel defining layer 3 that is close to the base substrate 1 such that the cathode signal line 2 may be prevented from blocking light emitted from the organic functional layer 6, and the cathode signal line 2 may be prevented from affecting a display effect. In addition, in a making process, the pixel defining layer 3 may be patterned to form a plurality of openings and at least one first via hole U1, such that the cathode signal line 2 may be coupled to the cathode layer 5 through the first via hole U1.

In an embodiment of the present disclosure, there are various implementations of the specific structure of the cathode signal line, and the implementations of the cathode signal line will be described in detail below in combination with the accompanying drawings.

Implementation 1

As shown in FIG. 4, the cathode signal line 2 may include: a first wire 21 arranged on the same layer as the anode layer, the first wire 21 is coupled to the cathode layer 5 through a first via hole U1. The plurality of anodes in the anode layer are generally arranged in the display area, and the cathode signal line 2 is arranged in the non-display area, such that the first wire 21 is arranged on the same layer as the anode layer, and the structure of the anode layer may not be affected. In addition, in a making process, the first wire 21 and the anode layer may be made of the same material through the same patterning process, such that one patterning process and cost are saved.

Implementation 2

Figure 5:
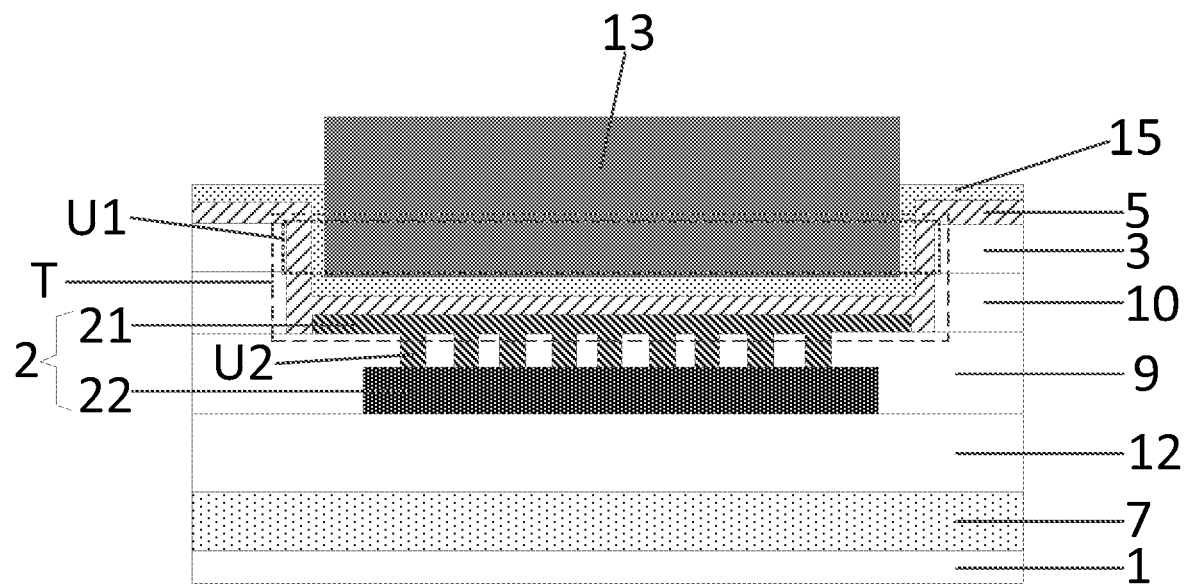
FIG. 5 is a fourth schematic structural diagram of a display panel according to an embodiment of the present disclosure.
Figure 6:
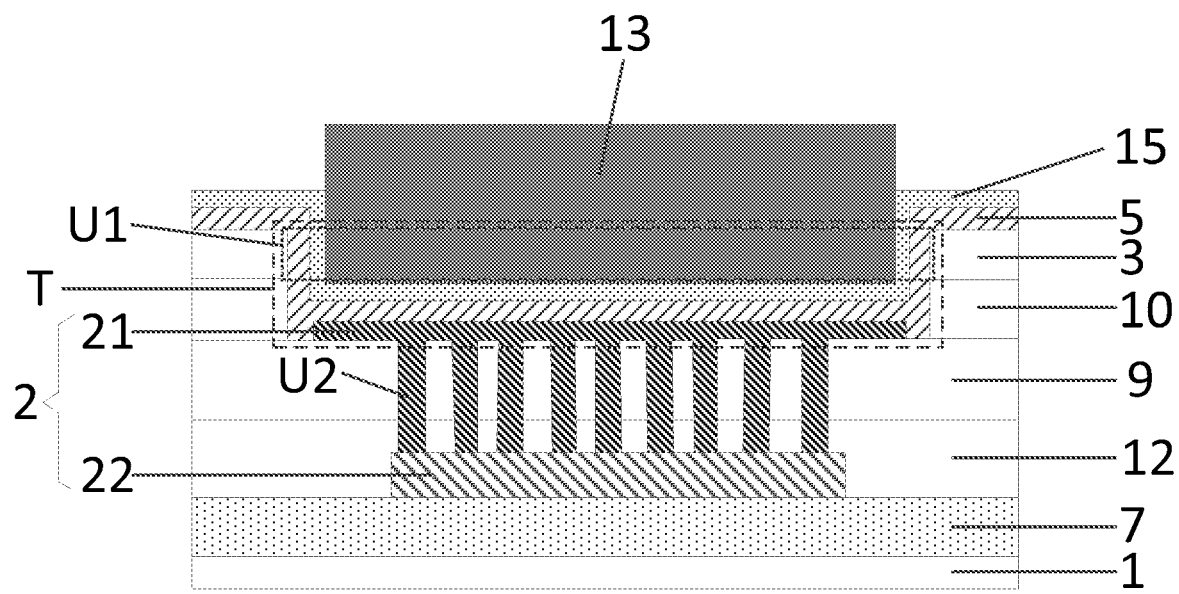
FIG. 6 is a fifth schematic structural diagram of a display panel according to an embodiment of the present disclosure.

FIG. 5 is a schematic structural diagram of another section of the non-display area in FIG. 1, and FIG. 6 is a schematic structural diagram of another section of the non-display area in FIG. 1. As shown in FIGS. 5 and 6, the above cathode signal line 2 may include: a first wire 21, and a second wire 22 arranged on a side of the first wire 21 that is close to the base substrate 1.

The first wire 21 is coupled to the cathode layer 5 through the first via hole U1, and the first wire 21 is coupled to the second wire 22 through one or more second via holes U2. The one or more second via holes U2 penetrate an insulating layer between the first wire 21 and the second wire 22.

In implementation 2, the cathode signal line 2 includes the first wire 21 and the second wire 22 that are stacked. Since the first wire 21 and the second wire 22 in the cathode signal line 2 are connected in parallel, and total resistance of the cathode signal line 2 is less than resistance of the first wire 21 or the second wire 22, such that the resistance of the cathode signal line 2 is reduced, and further an IR drop of the cathode signal transmitted by the cathode signal line 2 is reduced. Therefore, differences of the cathode signal applied to the cathode layer 5 by the cathode signal line 2 at different positions are small, and uniformity of the cathode signal transmitted in the cathode layer 5 is improved.

Optionally, the first wire 21 is coupled to the second wire 22 through a plurality of second via holes U2. In this way, a contact area between the second wire 22 and the first wire 21 may be enlarged, and the resistance of the cathode signal line 2 may be further reduced. Optionally, the number and distribution of the second via holes U2 may be set according to actual requirements, for example, the plurality of second via holes U2 may be uniformly distributed.

In combination with FIGS. 3, 5 and 6, during specific implementation, the above display panel provided in an embodiment of the present disclosure may further include: a source and drain metal layer (film layers marked with reference numerals 83 and 84 in FIG. 3) arranged on a side of the anode layer 6 that is close to the base substrate 1, and a gate metal layer (a film layer marked with reference numeral 82 in FIG. 3) arranged on a side of the source and drain metal layer that is close to the base substrate 1. The source and drain metal layer includes a source electrode 83 and a drain electrode 84, and the gate metal layer includes: a gate electrode 82.

The first wire 21 is arranged on the same layer as the anode layer 6. In a making process, the first wire 21 and the anode layer may be made of the same material through the same patterning process, such that one patterning process and making cost are saved.

As shown in FIGS. 3 and 5, the second wire 22 is arranged on the same layer as the source and drain metal layer, or as shown in FIGS. 3 and 6, the second wire 22 is arranged on the same layer as the gate metal layer. In this way, in a making process, the second wire 22 and the source and drain metal layer (or the gate metal layer) may be made through the same patterning process, such that one patterning process and making cost are saved. In addition, the gate metal layer and the source and drain metal layer are generally made of metal, such as metal molybdenum having desirable conductivity. The second wire 22 is arranged on the same layer as the source and drain metal layer or the gate metal layer, such that the cathode signal line 2 has desirable conductivity.

As shown in FIG. 3, the display panel may further include: an active layer 81 arranged on a side of the gate electrode 82 that is close to the base substrate 1, and the active layer 81, the gate electrode 82, the source electrode 83 and the electrode drain 84 may constitute a thin film transistor 8. The anodes of the anode layer 6 are connected to the drain electrode 84, such that an anode signal applied to the anodes may be controlled by controlling connection and disconnection of the thin film transistor 8.

In addition, the above display panel may further include: a buffer layer 7 arranged between the base substrate 1 and the active layer 81, a gate insulating layer 11 arranged between the active layer 81 and the gate electrode 82, an interlayer insulating layer 12 arranged between the gate electrode 82 and the source electrode 83, a passivation layer 9 arranged between the source electrode 83 and the anode layer 6, and a planarization layer arranged 10 between the passivation layer 9 and the anode layer 6. The anodes of the anode layer 6 are coupled to the drain electrode 84 through a via hole penetrating the passivation layer 9 and the planarization layer 10.

As shown in FIGS. 3 and 5, in the case that the second wire 22 is arranged on the same layer as the source and drain metal layer, the second via holes U2 penetrate the passivation layer 9 and the planarization layer 10, such that the first wire 21 is coupled to the second wire 22 through the second via holes U2.

As shown in FIGS. 3 and 6, in the case that the second wire 22 is arranged on the same layer as the gate metal layer, the second via holes U2 penetrate the interlayer insulating layer 12, the passivation layer 9 and the planarization layer 10, such that the first wire 21 is coupled to the second wire 22 through the second via holes U2.

Implementation 3

Figure 7:
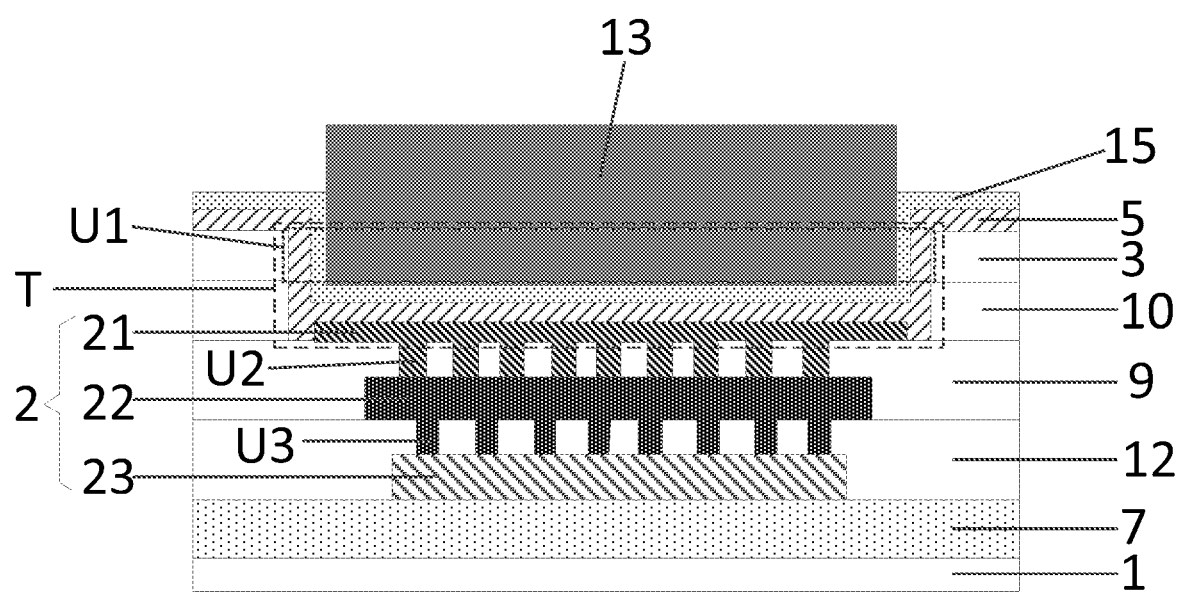
FIG. 7 is a sixth schematic structural diagram of a display panel according to an embodiment of the present disclosure.

FIG. 7 is a schematic structural diagram of another section of the non-display area in FIG. 1. As shown in FIG. 7, the above cathode signal lines may include: a first wire 21, a second wire 22 arranged on a side of the first wire 21 that is close to the base substrate 1, and a third wire 23 arranged on a side of the second wire 22 that is close to the base substrate 1.

The first wire 21 is coupled to the cathode layer 5 through the first via hole U1, and the first wire 21 is coupled to the second wire 22 through the second via holes U2. The second wire 22 is coupled to the third wire 23 through one or more third via holes U3. The second via holes U2 penetrate the insulating layer between the first wire 21 and the second wire 22. The third via holes U3 penetrate an insulating layer between the second wire 22 and the third wire 23.

In implementation 3, the cathode signal line 2 includes the first wire 21, the second wire 22 and the third wire 23 that are stacked. Since the first wire 21, the second wire 22, and the third wire 23 of the cathode signal line 2 are connected in parallel, and total resistance of the cathode signal line 2 is less than resistance of any one of the first wire 21, the second wire 22, and the third wire 23, the resistance of the cathode signal line 2 is reduced, and further, an IR drop of the cathode signal transmitted by the cathode signal line 2 may be reduced. Therefore, differences of the cathode signal applied to the cathode layer 5 by the cathode signal line 2 at different positions are small, such that uniformity of the cathode signal transmitted in the cathode layer 5 is improved.

Optionally, the first wire 21 is coupled to the second wire 22 through a plurality of second via holes U2; and/or the second wire 22 is coupled to the third wire 23 through a plurality of third via holes U3. In this way, the contact area between the second wire 22 and the first wire 21 may be enlarged, and a contact area between the second wire 22 and the third wire 23 may be enlarged, such that the resistance of the cathode signal line 2 is further reduced. Optionally, the number and distribution of the second via holes U2 and the third via holes U3 may be set according to actual requirements. For example, the plurality of second via holes U2 may be uniformly distributed, the plurality of third via holes U3 may be uniformly distributed, and the distribution of the second via holes U2 may be different from that of the third via holes U3.

In combination with FIGS. 3 and 7, during specific implementation, the above display panel provided in an embodiment of the present disclosure may further include: a source and drain metal layer (film layers marked with reference numerals 83 and 84 in FIG. 3) arranged on a side of the anode layer 6 that is close to the base substrate 1, and a gate metal layer (a film layer marked with reference numeral 82 in FIG. 3) arranged on a side of the source and drain metal layer that is close to the base substrate 1. The source and drain metal layer includes a source electrode 83 and a drain electrode 84, and the gate metal layer includes: a gate electrode 82.

The first wire 21 is arranged on the same layer as the anode layer 6. In a making process, the first wire 21 and the anode layer may be made of the same material through the same patterning process, such that one patterning process and making cost are saved.

The second wire 22 is arranged on the same layer as the source and drain metal layer. In a making process, the second wire 22 and the source and drain metal layer may be made through the same patterning process, such that one patterning process and making cost are saved.

The second via holes U2 penetrate the passivation layer 9 and the planarization layer 10, such that the first wire 21 is coupled to the second wire 22 through the second via holes U2.

The third wire 23 is arranged on the same layer as the gate metal layer. In a making process, the second wire 23 and the gate metal layer may be made through the same patterning process, such that one patterning process and making cost are saved. The third via holes U3 penetrate the interlayer insulating layer 12, such that the second wire 22 is coupled to the third wire 23 through the second via holes U2.

In addition, the gate metal layer and the source and drain metal layer are generally made of metal, such as metal molybdenum having desirable conductivity. The second wire 22 is arranged on the same layer as the source and drain metal layer, and the third wire 23 is arranged on the same layer as the gate metal layer, such that the cathode signal line 2 has desirable conductivity.

In an embodiment of the present disclosure, three implementations of the cathode signal line are described. During specific implementation, the specific structure of the cathode signal line may be set according to other implementations, which is not limited herein.

As shown in FIGS. 3 and 4, during specific implementation, the display panel provided in an embodiment of the present disclosure may further include: a sealant structure 13 arranged in the non-display area, and the sealant structure 13 is arranged on a side of the cathode layer 5 that faces away from the base substrate 1. In an embodiment of the present disclosure, the sealant structure is used to seal the display panel, such that the organic functional layer 4 and other structures may be sealed inside the display panel, and the situation that external water vapor and oxygen invade into the display panel to corrode the organic functional layer 4 and other structures may be prevented.

An orthographic projection of the sealant structure 13 on the base substrate 1 at least partially overlaps the orthographic projection of the cathode signal line 2 on the base substrate 1. That is, the cathode signal line 2 may be arranged within a coverage range of the sealant structure 13, that is, the orthographic projection of the cathode signal line 2 on the base substrate 1 is arranged within a range of the orthographic projection of the sealant structure 13 on the base substrate 1. In this way, the cathode signal line 2 may be shielded by the sealant structure 13, so as to prevent the cathode signal line 2 from increasing a width of a frame and implement a narrow frame. That is, in an embodiment of the present disclosure, on the basis of not increasing the width of the frame, an IR drop of the cathode layer 5 is reduced; or during specific implementation, the orthographic projection of the cathode signal line 2 on the base substrate 1 may only partially overlap the orthographic projection of the sealant structure 13 on the base substrate 1, such that the sealant structure 13 may shield part of the cathode signal line 2, and the width of the frame may also be less.

In addition, the orthographic projection of the cathode signal lines 2 on the base substrate 1 may not overlap the orthographic projection of the sealant structure 13 on the base substrate 1, but this implementation will increase the width of the frame.

In an embodiment of the present disclosure, it is a preferred implementation to set the orthographic projection of the cathode signal line 2 on the base substrate 1 to be arranged within the range of the orthographic projection of the sealant structure 13 on the base substrate 1. Certainly, during specific implementation, the position of the cathode signal line 2 may be set according to the actual structure of the display panel, which is not limited herein.

As shown in FIGS. 3 and 4, the above display panel provided in an embodiment of the present disclosure may further include: a pixel defining layer 3 arranged on a side of the anode layer 6 that faces away from the base substrate 1, and a planarization layer 10 arranged on a side of the anode layer 6 that is close to the base substrate. A through groove T penetrating the pixel defining layer 3 and the planarization layer 10 is provided in the non-display area, the through groove T surrounds the display area, and at least part of the sealant structure 13 is arranged in the through groove T.

Since the planarization layer 10 and the pixel defining layer 3 are generally made of organic materials, an effect of preventing water vapor is poor. In an embodiment of the present disclosure, by providing the through groove T penetrating the planarization layer 10 and the pixel defining layer 3 in the non-display area, that is, removing the planarization layer 10 and the pixel defining layer 3 at the position of the through groove T and embedding part of the sealant structure 13 in the through groove T, external water vapor may be further effectively blocked.

During specific implementation, in the above display panel provided in an embodiment of the present invention, as shown in FIG. 1, the sealant structure 13 is arranged in the non-display area surrounding the display area. Specifically, the sealant structure 13 may be in a closed-ring shape surrounding the display area AA. In this way, the sealant structure 13 has a desirable sealing effect on the internal structures of the display panel. Optionally, the through groove and the sealant structure 13 may have the same shape, and the through groove is of a closed structure. In this way, external water vapor may be further effectively blocked.

With further reference to FIGS. 3 and 4, at least part of the cathode signal line 2 is arranged in the through groove T, the orthographic projection of the cathode signal line 2 on the base substrate 1 is arranged in a range of an orthographic projection of the through groove T on the base substrate 1, part of the cathode layer 5 is embedded in the through groove T to be in lap joint with the cathode signal line 2, the cathode layer 5 embedded in the through groove T forms a groove surrounding the display area, and at least the sealant structure 13 is arranged in the groove. In this way, the orthographic projection of the cathode signal line 2 on the base substrate 1 is arranged within the range of the orthographic projection of the sealant structure 13 on the base substrate 1 such that the cathode signal line 2 may be shielded by the sealant structure 13, so as to prevent the cathode signal line 2 from increasing a width of a frame and implement a narrow frame.

Since the planarization layer 10 is arranged on the side of the anode layer 6 that is close to the base substrate 1, in a making process, before the anode layer 6 is formed, the planarization layer 10 at a position corresponding to the cathode signal line 2 will be removed. Therefore, the first wire 21 will fall into an area where the planarization layer 10 is removed, and the above through groove T includes the first via hole U1 and the area where the planarization layer 10 is removed. As shown in FIG. 4, in the case that the cathode signal line 2 only includes the first wire 21, the cathode signal line 2 is completely arranged in the through groove T. As shown in FIGS. 5 and 6, in the case that the cathode signal line 2 includes the first wire 21 and the second wire 22, or as shown in FIG. 7, in the case that the cathode signal line 2 includes the first wire 21, the second wire 22 and the third wire 23, part of the cathode signal line 2 is arranged in the through groove T.

During specific implementation, in the above display panel provided in an embodiment of the present disclosure, as shown in FIG. 4, a surface of the side of the sealant structure 13 that faces away from the base substrate 1 is raised relative to a surface of a side of the cathode layer 5 that is arranged outside the through groove T and faces away from the base substrate 1, that is, a thickness of the sealant structure 13 is greater than a depth of the groove formed by the cathode layer 5, such that the internal structures of the display panel may be effectively sealed.

As shown in FIG. 4, the above display panel provided in an embodiment of the present disclosure may further include: an inorganic layer 15 arranged between the sealant structure 13 and the cathode layer 5 and covers the display area and the non-display area. The inorganic layer has a desirable effect of blocking water vapor and oxygen. By sealing the display panel through a sealing method of combining the inorganic layer 15 and the sealant structure 13, the display panel may be effectively sealed.

As shown in FIG. 3, the sealant structure 13 is higher than the other film layers in the display area. In order to fill up differences between the sealant structure 13 and the other film layers, the above display panel provided in an embodiment of the present disclosure may further include: a color film layer 16 arranged on a side of the inorganic layer 15 that faces away from the base substrate 1, the color film layer 16 fills an area surrounded by the sealant structure 13, and a surface of a side of the color film layer 16 that faces away from the base substrate 1 is flush with a surface of a side of the sealant structure 13 that faces away from the base substrate 1. Thus, a surface of the display panel may be relatively flat. Optionally, the color film layer 16 may include color filter units of at least three colors, so as to emit light of different colors to realize color display. It should be noted that the surface of the color film layer 16 is flush with the surface of the sealant structure 13 within a certain error range.

With further reference to FIG. 3, the above display panel provided in an embodiment of the present disclosure may further include: a cover plate 14 arranged on the sides of the sealant structure 13 and the color film layer 16 that face away from the base substrate 1. The cover plate 14 may protect the internal structures of the display panel, and the surface of the color film layer 16 is flush with the surface of the sealant structure 13, such that the cover plate 14 may be arranged above the film layer having a flat surface without damaging the cover plate 14, and a sealing effect of the display panel is better.

It should be noted that the above display panel provided in an embodiment of the present disclosure may further include other functional film layers known to those skilled in the art, which are not described in detail herein.

During specific implementation, in the above display panel provided in an embodiment of the present disclosure, the display panel may be in a regular shape such as an elliptical, round or rectangular shape, or in other irregular shapes, as long as the cathode signal line surrounds the display area and overlaps the sealant structure, which all fall within the scope of protection of the present disclosure.

During specific implementation, the above display panel provided in an embodiment of the present disclosure may be a top light-emitting structure or a bottom light-emitting structure. Specifically, as shown in FIG. 3, the anodes of the anode layer 6, the organic functional layer 4 and the cathode layer 5 constitute an organic light-emitting device. In the case that the organic light-emitting device is a top-emitting structure, that is, the organic light-emitting device emits light from the side of the cathode layer 5 that faces away from the anode layer 6, a pixel circuit constituted by the thin film transistor 8 may be arranged below the organic light-emitting device. In this case, the anode layer 6 may be an opaque electrode serving as a reflective electrode, and the cathode layer 5 is a transparent electrode. In the case that the organic light-emitting device is a bottom light-emitting structure, that is, the organic light-emitting device emits light from the side of the anode layer 6 that faces away from the cathode layer 5, a pixel circuit formed by the thin film transistor 8 is required to be arranged outside a light-emitting area of the organic light-emitting device, so as to guarantee that no adverse effect on display is caused. In this case, the anode layer 6 is a transparent electrode, and the cathode layer 5 is an opaque electrode serving as a reflective electrode. Specifically, the transparent electrode may include indium tin oxide, indium zinc oxide, zinc oxide or indium oxide, etc., and the reflective electrode may be formed of gold, silver, copper, nickel, aluminum, molybdenum, etc., or a mixture thereof.

It should be noted that an embodiment provided in the present disclosure is only described by taking the organic light-emitting display panel as an example, but the present disclosure is not limited to the organic light-emitting display panel. The display panel in the present disclosure may be a quantum dot light-emitting diode display panel (QLED) and other possible panel types, which are not limited herein.

On the basis of the same inventive concept, an embodiment of the present disclosure further provides a display apparatus. The display apparatus includes the above display panel provided in an embodiment of the present disclosure. The problem solving principle of the display apparatus is similar to that of the above display panel, such that the implementation of the display apparatus can be obtained with reference to the implementation of the above display panel, which is not repeated herein.

During specific implementation, the above display apparatus provided in an embodiment of the present disclosure may be a tablet computer, a television, a display, a laptop, a digital photo frame, a navigator and other products or components having display functions. Other essential components of the display apparatus will be understood by those of ordinary skill in the art, are not repeated herein, and should not be taken as a limitation to the present disclosure.

According to the display panel and the display apparatus provided in embodiments of the present disclosure, the display panel is provided with the display area and the non-display area surrounding the display area, and includes: the base substrate, the anode layer, the cathode layer, the organic functional layer and the cathode signal line. The cathode signal line is arranged on the side of the organic functional layer that is close to the base substrate, and the cathode signal line is arranged in the non-display area. The orthographic projection of the cathode signal line on the base substrate and the orthographic projection of the organic functional layer on the base substrate have the non-overlapping area, the non-overlapping area includes at least two mutually separated sub-areas, and the cathode signal line is coupled to the cathode layer in the at least two mutually separated sub-areas. In the present disclosure, the cathode signal line that is arranged on a different layer from the cathode lay and is coupled to the cathode layer is arranged, and the cathode signal line is arranged in the non-display area, such that the contact area between the cathode signal line and the cathode layer is enlarged, and equivalent resistance at the junction between the cathode signal line and the cathode layer is reduced. Moreover, the cathode signal line may provide a cathode signal to the cathode layer at a plurality of positions, such that a reduction amplitude of the cathode signal at positions far away from a signal source is reduced. Therefore, by inputting the cathode signal into the cathode layer by the cathode signal line, an IR drop of the cathode layer is reduced, and display uniformity of the display panel is improved.

Obviously, those skilled in the art can make various amendments and variations to the present disclosure without departing from the spirit and scope of the present disclosure. In this way, it is intended that the present disclosure also encompasses these amendments and variations if these amendments and variations to the present disclosure fall within the scope of the claims of the present disclosure and the equivalents thereof

What is claimed is:

1. A display panel, being provided with a display area and a non-display area surrounding the display area, and comprising:
   a base substrate;
   an anode layer arranged on the base substrate;
   a cathode layer arranged on a side of the anode layer facing away from the base substrate, wherein an orthographic projection of the cathode layer on the base substrate overlaps orthographic projections of the display area and the non-display area on the base substrate;
an organic functional layer arranged between the anode layer and the cathode layer, wherein an orthographic projection of the organic functional layer on the base substrate overlaps the orthographic projection of the display area on the base substrate; and
a cathode signal line arranged on a side of the organic functional layer close to the base substrate, wherein the cathode signal line is arranged in the non-display area, an orthographic projection of the cathode signal line on the base substrate has an overlapping area and a non-overlapping area with the orthographic projection of the organic functional layer on the base substrate, the non-overlapping area comprises at least two sub-areas, two adjacent sub-areas of the at least two sub-areas are separated by a sub-area comprised in the overlapping area, and the cathode signal line is coupled to the cathode layer in the at least two sub-areas.

2. The display panel according to claim 1, wherein the cathode signal line surrounds the display area.

3. The display panel according to claim 1, further comprising: a pixel defining layer arranged on the side of the anode layer facing away from the base substrate; wherein the pixel defining layer comprises a first via hole arranged in the non-display area; and
the cathode signal line is arranged on a side of the pixel defining layer close to the base substrate, and the cathode signal line is coupled to the cathode layer through the first via hole.

4. The display panel according to claim 3, wherein the cathode signal line comprises:
a first wire arranged on a same layer as the anode layer, and the first wire is coupled to the cathode layer through the first via hole.

5. The display panel according to claim 3, wherein the cathode signal line comprises:
a first wire, and a second wire arranged on a side of the first wire close to the base substrate;
the first wire is coupled to the cathode layer through the first via hole, and the first wire is coupled to the second wire through a second via hole; and the second via hole penetrates an insulating layer between the first wire and the second wire.

6. The display panel according to claim 5, wherein the first wire is coupled to the second wire through a plurality of second via holes.

7. The display panel according to claim 5, further comprising: a source and drain metal layer arranged on a side of the anode layer close to the base substrate, and a gate metal layer arranged on a side of the source and drain metal layer close to the base substrate;
wherein the first wire is arranged on a same layer as the anode layer; and
the second wire is arranged on a same layer as the source and drain metal layer, or the second wire is arranged on a same layer as the gate metal layer.

8. The display panel according to claim 3, wherein the cathode signal line comprises: a first wire, a second wire arranged on a side of the first wire close to the base substrate, and a third wire arranged on a side of the second wire close to the base substrate;
the first wire is coupled to the cathode layer through the first via hole, and the first wire is coupled to the second wire through a second via hole; the second wire is coupled to the third wire through a third via hole; the second via hole penetrates an insulating layer between the first wire and the second wire; and the third via hole penetrates an insulating layer between the second wire and the third wire.

9. The display panel according to claim 8, wherein the first wire is coupled to the second wire through a plurality of second via holes; and/or the second wire is coupled to the third wire through a plurality of third via holes.

10. The display panel according to claim 8, further comprising: a source and drain metal layer arranged on a side of the anode layer close to the base substrate, and a gate metal layer arranged on a side of the source and drain metal layer close to the base substrate; wherein
the first wire is arranged on a same layer as the anode layer, the second wire is arranged on a same layer as the source and drain metal layer, and the third wire is arranged on a same layer as the gate metal layer.

11. The display panel according to claim 1, further comprising: a sealant structure arranged in the non-display area; wherein
the sealant structure is arranged on a side of the cathode layer facing away from the base substrate; and
an orthographic projection of the sealant structure on the base substrate at least partially overlaps the orthographic projection of the cathode signal line on the base substrate.

12. The display panel according to claim 11, further comprising: a pixel defining layer arranged on the side of the anode layer facing away from the base substrate, and a planarization layer arranged on a side of the anode layer close to the base substrate; wherein
the non-display area is provided with a through groove penetrating the pixel defining layer and the planarization layer, and the through groove surrounds the display area; and
at least part of the sealant structure is arranged in the through groove.

13. The display panel according to claim 12, wherein at least part of the cathode signal line is arranged in the through groove, and the orthographic projection of the cathode signal line on the base substrate is arranged within a range of an orthographic projection of the through groove on the base substrate;
part of the cathode layer is embedded in the through groove and is in lap joint with the cathode signal line; and
the part of the cathode layer embedded in the through groove forms a groove surrounding the display area, and at least the sealant structure is arranged in the groove.

14. The display panel according to claim 12, wherein a surface of a side of the sealant structure facing away from the base substrate is raised relative to a surface of a side of the cathode layer arranged outside the through groove and facing away from the base substrate.

15. The display panel according to claim 14, further comprising: an inorganic layer arranged between the sealant structure and the cathode layer and covering the display area and the non-display area.

16. The display panel according to claim 15, further comprising: a color film layer arranged on a side of the inorganic layer facing away from the base substrate; wherein
the color film layer fills an area surrounded by the sealant structure; and
a surface of a side of the color film layer facing away from the base substrate is flush with a surface of a side of the sealant structure facing away from the base substrate.

17. The display panel according to claim 16, further comprising: a cover plate arranged on the sides of the sealant structure and the color film layer facing away from the base substrate.

18. The display panel according to claim 12, wherein the sealant structure is in a closed-ring shape surrounding the display area.

19. The display panel according to claim 18, wherein the through groove and the sealant structure have a same shape, and the through groove is in a closed structure;
   wherein a shape of the display panel is an elliptical, round or rectangular.

20. A display apparatus, comprising a display panel being provided with a display area and a non-display area surrounding the display area, wherein the display panel comprises:
   a base substrate;
   an anode layer arranged on the base substrate;
   a cathode layer arranged on a side of the anode layer facing away from the base substrate, wherein an orthographic projection of the cathode layer on the base substrate overlaps orthographic projections of the display area and the non-display area on the base substrate;
   an organic functional layer arranged between the anode layer and the cathode layer, wherein an orthographic projection of the organic functional layer on the base substrate overlaps the orthographic projection of the display area on the base substrate; and
   a cathode signal line arranged on a side of the organic functional layer close to the base substrate, wherein the cathode signal line is arranged in the non-display area, an orthographic projection of the cathode signal line on the base substrate has an overlapping area and a non-overlapping area with the orthographic projection of the organic functional layer on the base substrate, the non-overlapping area comprises at least two sub-areas, two adjacent sub-areas of the at least two sub-areas are separated by a sub-area comprised in the overlapping area, and the cathode signal line is coupled to the cathode layer in the at least two sub-areas.

* * * * *